United States Patent
Lv et al.

(10) Patent No.: US 9,401,418 B2
(45) Date of Patent: Jul. 26, 2016

(54) METHOD OF MANUFACTURING THIN FILM TRANSISTOR AND ORGANIC LIGHT EMITTING DIODE DISPLAY

(71) Applicant: SHENZHEN CHINA STAR OPTOELECTRONICS TECHNOLOGY CO., LTD., Shenzhen, Guangdong (CN)

(72) Inventors: Xiaowen Lv, Guangdong (CN); Chihyuan Tseng, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 71 days.

(21) Appl. No.: 14/366,866

(22) PCT Filed: Apr. 28, 2014

(86) PCT No.: PCT/CN2014/076407
§ 371 (c)(1),
(2) Date: Feb. 27, 2015

(87) PCT Pub. No.: WO2015/161523
PCT Pub. Date: Oct. 29, 2015

(65) Prior Publication Data
US 2015/0311322 A1 Oct. 29, 2015

(30) Foreign Application Priority Data
Apr. 23, 2014 (CN) .......................... 2014 1 0165431

(51) Int. Cl.
*H01L 29/66* (2006.01)
*H01L 27/32* (2006.01)
*H01L 21/02* (2006.01)
*H01L 21/311* (2006.01)
*H01L 29/786* (2006.01)
*H01L 21/027* (2006.01)

(52) U.S. Cl.
CPC ...... *H01L 29/66969* (2013.01); *H01L 21/0206* (2013.01); *H01L 21/0274* (2013.01); *H01L 21/31144* (2013.01); *H01L 27/3244* (2013.01); *H01L 29/7869* (2013.01)

(58) Field of Classification Search
CPC ....... H01L 51/56; H01L 29/66; H01L 29/786; H01L 21/283; H01L 29/66969; H01L 29/7869; H01L 29/41733; H01L 27/32; H01L 27/3244; H01L 27/1203; H01L 27/1259; H01L 27/3211; H01L 27/3248; H01L 21/02; H01L 21/0206; H01L 21/311; H01L 21/31144; H01L 21/77; H01L 21/84; H01L 21/76264; H01L 21/82343
USPC ............... 438/104, 23, 34, 149, 48, 153, 311, 438/479, 517
See application file for complete search history.

(56) References Cited

U.S. PATENT DOCUMENTS

2013/0069058 A1* 3/2013 Yamazaki et al. .............. 257/43

FOREIGN PATENT DOCUMENTS

| CN | 1355561 | 6/2002 |
| CN | 1405865 | 3/2003 |
| CN | 1477612 | 2/2004 |

(Continued)

OTHER PUBLICATIONS

International Search Report for PCT/CN2014/076407, English translation attached to original, Both completed by the Chinese Patent Office on Dec. 23, 2014, Mailed Feb. 4, 2015, All together 8 Pages.

*Primary Examiner* — Chuong A Luu
(74) *Attorney, Agent, or Firm* — Brooks Kushman P.C.

(57) ABSTRACT

A method of manufacturing transistor having a first and second thin film transistor by creating the second thin film transistor by forming a second gate of the second thin film transistor on a substrate, depositing an insulating layer and a semiconductor layer in order to cover the second gate. A photoresist layer is deposited above the semiconductor layer and exposed. The semiconductor layer and the insulating layer are etched, thereby forming a second active layer of the second thin film transistor and a first connection window disposed above the second gate. A second source and a second drain of the second thin film transistor is deposited above the insulating layer and the second active layer. The present method enables the manufacturing of an organic light emitting diode display. The method reduces the times of using a photomask, thereby saving the manufacture time, improving the productivity and economizing the manufacture cost.

20 Claims, 3 Drawing Sheets

(56) References Cited

FOREIGN PATENT DOCUMENTS

| CN | 102427061 | 4/2012 |
| CN | 102623399 | 8/2012 |
| CN | 103700707 | 4/2014 |
| CN | 103928343 | 7/2014 |

\* cited by examiner

METHOD OF MANUFACTURING THIN FILM TRANSISTOR AND ORGANIC LIGHT EMITTING DIODE DISPLAY

CROSS-REFERENCE TO RELATED APPLICATION

This application is the U.S. national phase of PCT Application No. PCT/CN2014/076407 filed on Apr. 28, 2014, which claims priority to CN Patent Application No. 201410165431.3 filed on Apr. 23, 2014, the disclosures of which are incorporated in their entirety by reference herein.

BACKGROUND

1. Technical Field

The present invention relates to a liquid crystal display technical field; more particularly, to a method of manufacturing a thin film transistor and a method of an organic light emitting diode display.

2. Background Art

A flat panel display is widely applied for the advantages, such as thin body, low power consumption, etc., and the existing flat panel display generally includes a liquid crystal display (LCD) and an organic light emitting diode display (OLED).

The organic light emitting diode display is a self-luminous display device that displays an image through an organic light emitting diode. Different from the liquid crystal display (LCD), the organic light emitting diode display emits the light using the energy generated by excitons, which are generated by combining electron-hole in the organic emitting layer, from an excited state to a ground state, which does not need a separate light source accordingly, thereby having small thickness and weight. In addition, since the organic light emitting diode display presents a high quality character, such as, low power consumption, high lightness and short response time, which is eye-catching as a next generation display device of the portable electronic device.

A Thin Film Transistor (TFT) is generally used as a drive in the organic light emitting diode display, thereby realizing display screen information with high speed, high lightness and high contrast. In recent years, the thin film transistor of based on metal oxide is given more and more importance for the advantages, such as high mobility, good light transmission, stable thin film structure, low manufacture temperature and low cost, etc. Especially, the metal oxide TFT of In—Ga—Zn—O (IGZO) as the representative and the current a-Si TFT have relatively high manufacturing compatibility, which are hereby widely applied in manufacturing an OLED panel having a large size.

Referring to FIG. 1, a 2Tr-1Cap structure widely applied in the OLED of the prior art is illustrated, one organic light emitting diode 30, two thin film transistors 10 and 20 and a capacitor 40 are included in each of pixel regions. Wherein the first thin film transistor 10 provides a switch voltage for the second thin film transistor 20 as a switch, and the second thin film transistor 20 is used for providing a drive circuit for the organic light emitting diode 30. A first gate of the first thin film transistor 10 is connected to a scan line 510; a first source of the first thin film transistor 10 is connected to a data line 520; a first drain of the first thin film transistor 10 is connected to a second gate of the second thin film transistor 20, and meanwhile connected to a second source of the second thin film transistor 20 through the capacitor 40; a second source of the second thin film transistor 20 is connected to a common power supply line 530; a second drain of the second thin film transistor 20 is connected to an anode of the organic light emitting diode 30 for providing a drive circuit for the organic light emitting diode 30.

Referring to FIG. 2, a method of manufacturing a thin film transistor provided by the prior art is illustrated, wherein the depositing of the second thin film transistor 20 includes:

i) depositing a conductive layer on a substrate 210, depositing a photoresist layer on the conductive layer, and exposing and photoetching the photoresist layer simultaneously, thereby forming a first gate 121 of the first thin film transistor 10 and a second gate 221 of the second thin film transistor 20;

ii) depositing an insulating layer 230 above the substrate 210, the insulating layer 230 covers the first gate 121 and the second gate 221, depositing a photoresist layer above the insulating layer 230, and exposing and photoetching the photoresist layer simultaneously, thereby forming one first connection window 231 on the insulating layer 230 above the second gate 221;

iii) depositing an oxide semiconductor layer 240 above the insulating layer 230, depositing a photoresist layer above the oxide semiconductor layer 240, and exposing and photoetching the photoresist layer simultaneously, thereby forming a first active layer 141 of the first thin film transistor 10 and a second active layer 241 of the second thin film transistor 20; and iv) depositing a second source 251 and a second drain 252 of the second thin film transistor 20 above the insulating layer 230 and the second active layer 241, and meanwhile depositing the first source 151 and the first drain 152 of the first thin film transistor 10 above the insulating layer 230 and the first active layer 141, wherein the first drain 152 is electrically connected to the second gate 221 through the first connection window 231.

The above process is subjected to be exposed for three times by a yellow light machine, such that the manufacture time increases, and the productivity is lowered, thereby increasing the manufacturing cost.

SUMMARY

In order to solve the existing problem in the above prior art, the purpose of the present invention is directed to providing a method of manufacturing a thin film transistor and an organic light emitting diode display which reduces the times of using a photomask and the manufacture time and improves the productivity.

In order to realize the above purposes, one of the purposes of the present invention is to provide a method of manufacturing a thin film transistor which includes depositing a first thin film transistor and a second thin film transistor, wherein the following steps are adopted to deposit the second thin film transistor:

a) forming a second gate of the second thin film transistor on the substrate;

b) depositing an insulating layer and a semiconductor layer in order above the substrate, wherein the insulating layer and the semiconductor layer cover the second gate;

c) depositing a photoresist layer above the semiconductor layer and exposing the photoresist layer; etching the semiconductor layer and the insulating layer, thereby forming a second active layer of the second thin film transistor and a first connection window disposed above the second gate;

d) depositing a second source and a second drain of the second thin film transistor above the insulating layer and the second active layer.

Wherein the exposing of the photoresist particularly includes: fully exposing the photoresist where the first connection window is to be formed; not exposing the photoresist where the second active layer is to be formed; and half-exposing the rest of the photoresist above the second thin film transistor.

Wherein the etching of the semiconductor layer and the insulating layer particularly includes: etching the semiconductor layer and the insulating layer in the full exposure window to form the first connection window; removing the half-exposed photoresist; etching the semiconductor layer in the half exposure window to form the second active layer; and removing the photoresist layer above the second active layer.

Wherein the etching of the semiconductor layer and the insulating layer in the full exposure window particularly includes: removing the semiconductor layer in the full exposure window using a wet etching method; removing the insulating layer in the full exposure window using a dry etching method.

Wherein the semiconductor layer in the half exposure window is etched using a wet etching method.

Wherein the half-exposed photoresist is removed using an $O_2$ ashing method.

Wherein the first drain of the first thin film transistor is electrically connected to the second gate through the first connection window.

Wherein the first and second thin film transistors are both the metal oxide thin film transistors.

Wherein the first and second thin film transistors have a BCE structure or an ESL structure.

Another purpose of the present invention is to provide a method of manufacturing an organic light emitting diode display, which adopts the method of manufacturing a thin film transistor as said above.

Advantageous Effects

The method of manufacturing the thin film transistor and the organic light emitting diode display provided by the present invention reduces the times of using a photomask by directly depositing the insulating layer and the semiconductor layer and exposing and half-exposing the photoresist deposited thereon, thereby saving the manufacture time, improving the productivity and economizing the manufacture cost.

DETAILED DESCRIPTION OF EXEMPLARY EMBODIMENTS

As above mentioned, in order to reduce the times of using a photomask, saving the manufacturing time and improve the productivity, the present invention provides a method of manufacturing a thin film transistor which includes depositing the first thin film transistor and the second thin film transistor, wherein the following steps are adopted to deposit the second thin film transistor: forming a second gate of the second thin film transistor on the substrate; depositing an insulating layer and a semiconductor layer in order above the substrate, wherein the insulating layer and the semiconductor layer cover the second gate; depositing a photoresist layer above the semiconductor layer and exposing the photoresist layer; etching the semiconductor layer and the insulating layer, thereby forming a second active layer of the second thin film transistor and a first connection window disposed above the second gate; and depositing a second source and a second drain of the second thin film transistor above the insulating layer and the second active layer.

Below the preferred embodiments of the present invention are described in detail in conjunction with the accompanying drawings in order to better set forth the technical features and the structures of the present invention.

Embodiment 1

Figure 1:
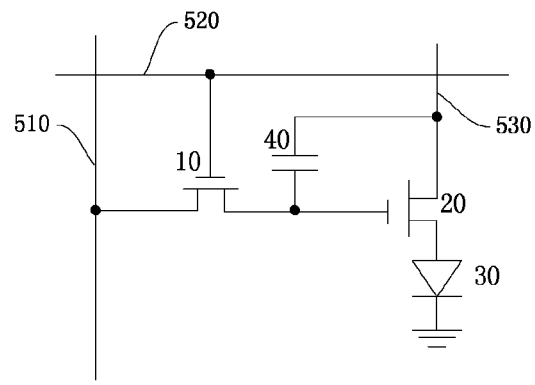
FIG. 1 is a structure schematic diagram of the organic light emitting diode drive structure having a 2Tr-1Cap structure provided by the prior art.
Figure 2:
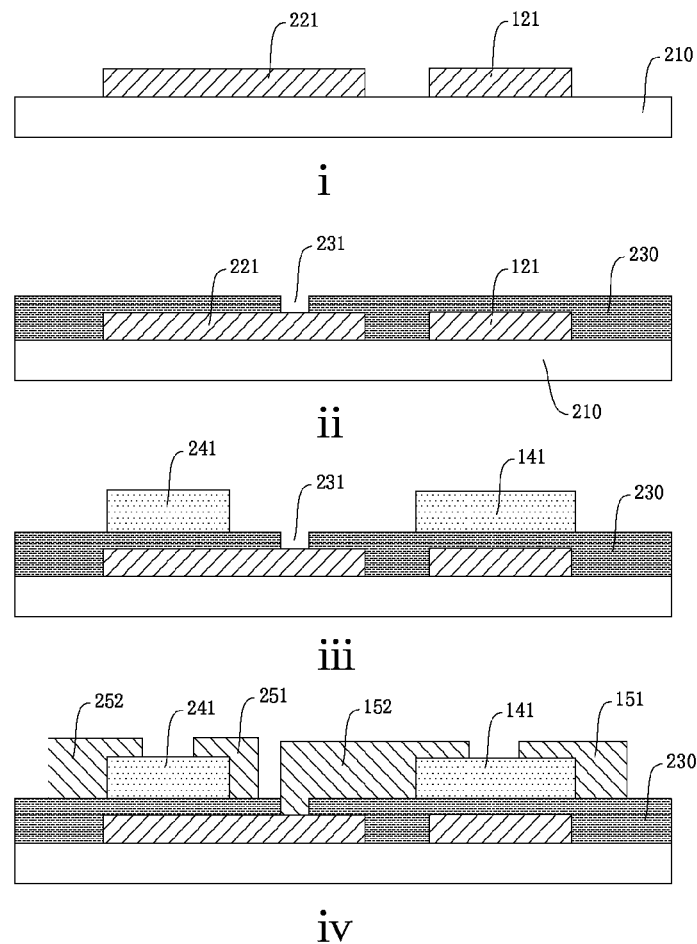
FIG. 2 is a schematic diagram of the method of manufacturing a thin film transistor provided by the prior art.

The present embodiment explains the invention using a pixel region including two thin film transistors and one capacitor having a 2Tr-1Cap structure as illustrated in FIG. 1, wherein the first thin film transistor 10 and the second thin film transistor 20 are both the metal oxide thin film transistors. Or, in other embodiments, the first thin film transistor 10 may also be a polysilicon thin film transistor matched with the second thin film transistor 20. Or, in other embodiments, the method of manufacturing three or more thin film transistors included in the pixel region may also adopt the solution revealed in the present embodiment, wherein the rest of the thin film transistor and the capacitor are the supplementary circuit for improving the uniformity of the organic light emitting diode 30. The 2Tr-1Cap structure is similar to that of the prior art, which is not explained in more detail here.

Figure 3:
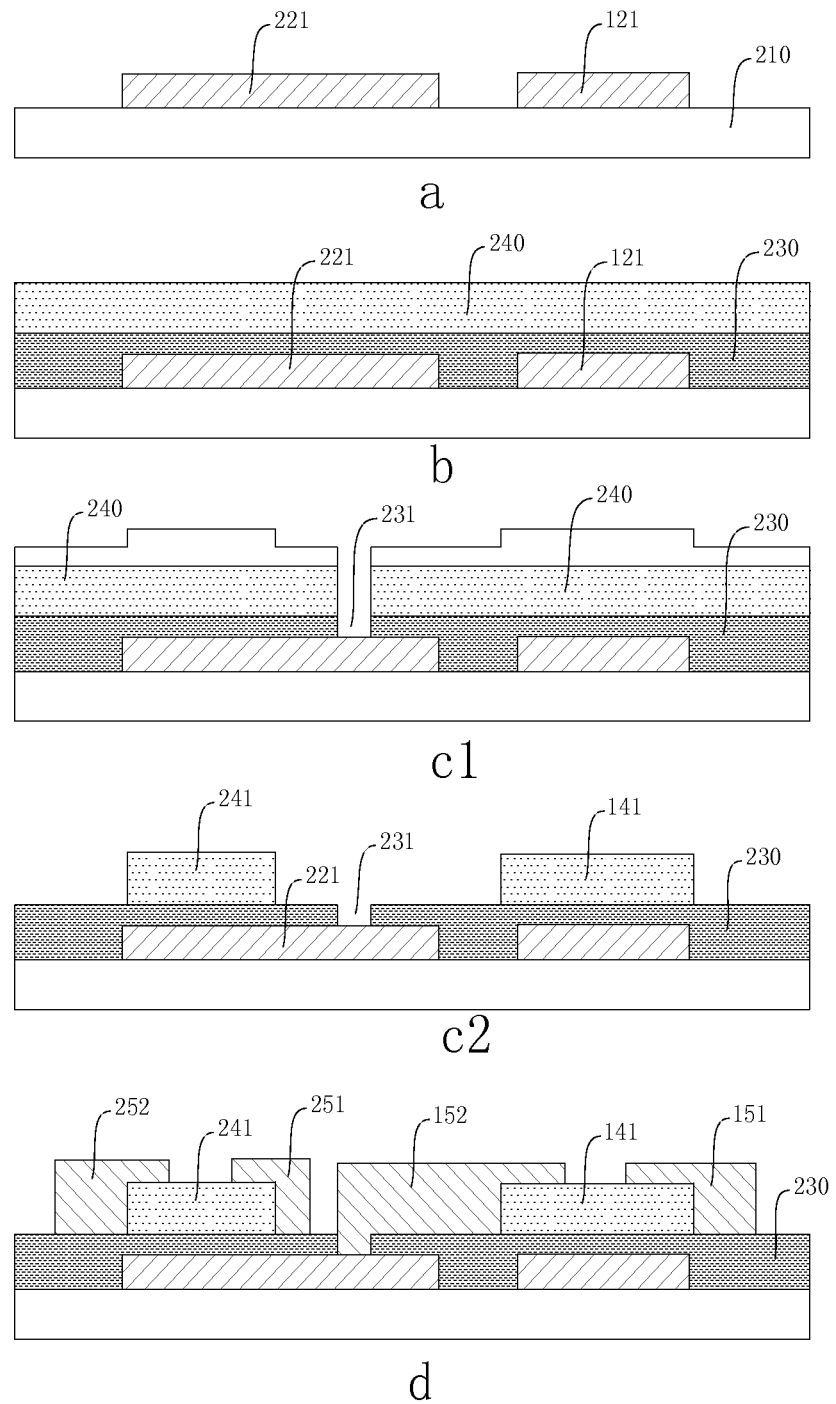
FIG. 3 is a schematic diagram of the method of manufacturing a thin film transistor provided by the embodiment 1 of the present invention.

As illustrated in FIG. 3, the first thin film transistor 10 and the second thin film transistor 20 provided by the present embodiment both are a back channel etch (BCE) structure, of which the manufacture method includes:

a) forming a conductive layer on a substrate 210, depositing a photoresist layer on the conductive layer, and exposing and photoetching the photoresist layer simultaneously, thereby forming a first gate 121 of the first thin film transistor 10 and a second gate 221 of the second thin film transistor 20;

b) depositing an insulating layer 230 and a semiconductor layer 240 in order above the substrate, wherein the semiconductor layer 240 covers the insulating layer 230, the insulating layer 230 covers the first gate 121 and the second gate 221. In the present embodiment, the material of the insulating layer 230 is silicon oxide, and the material of the semiconductor layer 240 is IGZO. Of course, in other embodiments, the material of the insulating layer 230 may also be silicon nitride.

c) depositing a photoresist layer above the semiconductor layer 240 and exposing the photoresist layer; etching the semiconductor layer 240 and the insulating layer 230, thereby forming a first active layer 141 of the first thin film transistor 10, a second active layer 241 of the second thin film transistor 20 and a first connection window 231 disposed above the second gate 221;

d) depositing a second source 251 and a second drain 252 of the second thin film transistor 20 above the insulating layer 230 and the second active layer 241, depositing the first source 151 and the first drain 152 of the first thin film transistor 10 above the insulating layer 230 and the first active layer 141, wherein the first drain 152 is electrically connected to the second gate 221 through the first connection window 231.

Furthermore, the step c) particularly includes:

c1) fully exposing the photoresist where the first connection window 231 is to be formed; not exposing the photoresist where the first active layer 141 and the second active layer 241 are to be formed; and half-exposing the rest of the photoresist. The semiconductor layer 240 in the full exposure window is etched by using a wet etching method, and then the insulating layer 230 in the full exposure window is etched by using a dry etching method, thereby forming the first connection window 231. c2) The half-exposed photoresist is removed by using an O2 ashing method, and then the semiconductor layer 240 in the half exposure window is etched by using a wet etching method, thereby forming a first active layer 141 and a second active layer 241. Finally, the photoresist above the first active layer 141 and the second active layer 241 is removed.

The above process is subjected to be exposed for two times by a yellow light machine, and compared with the prior art, the exposure times are reduced, such that the manufacture time decreases, and the productivity increases, thereby reducing the manufacturing cost.

Based on the same inventive concept, the present embodiment further provides a method of manufacturing an organic light emitting diode display, which adopts the above mentioned method to deposit the thin film transistor on the substrate.

Embodiment 2

Figure 4:
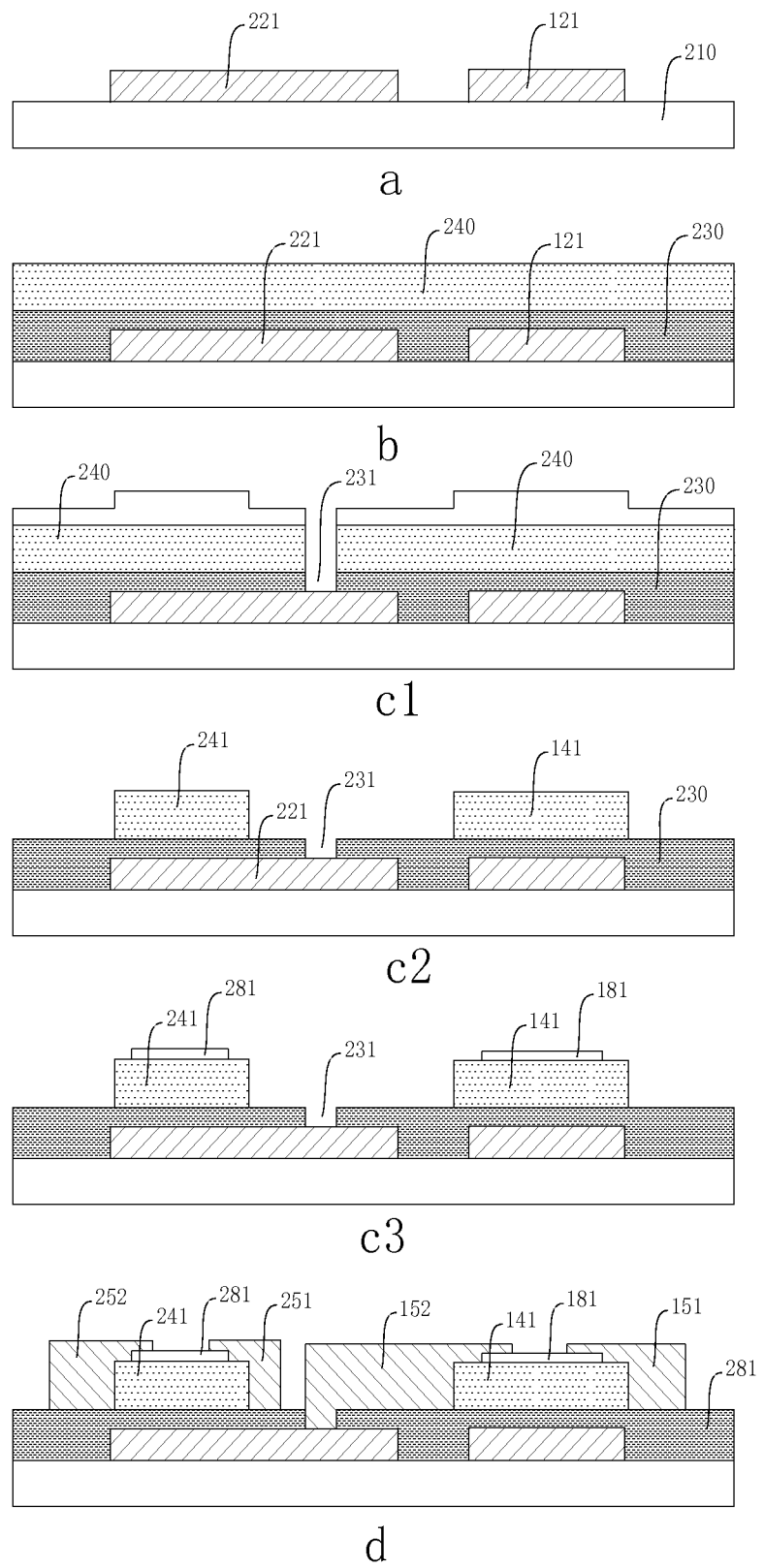
FIG. 4 is a schematic diagram of the method of manufacturing a thin film transistor provided by the embodiment 2 of the present invention.

The present embodiment is different from the embodiment 1 in: the first thin film transistor 10 and the second thin film transistor 20 provided by the present embodiment both have an etch stop layer (ESL) structure. Referring to FIG. 4, the manufacturing method particularly includes:

a) forming a conductive layer on a substrate 210, depositing a photoresist layer on the conductive layer, and exposing and photoetching the photoresist layer simultaneously, thereby forming a first gate 121 of the first thin film transistor 10 and a second gate 221 of the second thin film transistor 20;

b) depositing an insulating layer 230 and a semiconductor layer 240 in order above the substrate, wherein the semiconductor layer 240 covers the insulating layer, the insulating layer 230 covers the first gate 121 and the second gate 221. In the present embodiment, the material of the insulating layer 230 is silicon oxide, and the material of the semiconductor layer 240 is IGZO. Of course, in other embodiments, the material of the insulating layer 230 may also be silicon nitride.

c) depositing a photoresist layer above the semiconductor layer 240 and exposing the photoresist layer; etching the semiconductor layer 240 and the insulating layer 230, thereby forming a first active layer 141 of the first thin film transistor 10, a second active layer 241 of the second thin film transistor 20 and a first connection window 231 disposed above the second gate 221;

c) depositing a first etch stop layer 181 and a second etch stop layer 281 above the first active layer 141 and the second active layer 241, respectively, wherein the sizes of the first etch stop layer 181 and the second etch stop layer 281 are smaller than those of the first active layer 141 and the second active layer 241, respectively.

d) depositing a second source 251 and a second drain 252 of the second thin film transistor 20 above the insulating layer 230 and the second etch stop layer 281, wherein the second source 251 and the second drain 252 are electrically connected to the second active layer 241; depositing a first source 151 and a first drain 152 of the first thin film transistor 10 above the insulating layer 230 and the first etch stop layer 181, wherein the first source 151 and the first drain 152 are electrically connected to the first active layer 141, the first drain 152 is electrically connected to the second gate 221 through the first connection window 231.

Furthermore, the step c) particularly includes:

c1) fully exposing the photoresist where the first connection window 231 is to be formed; not exposing the photoresist where the first active layer 141 and the second active layer 241 are to be formed; and half-exposing the rest of the photoresist. The semiconductor layer 240 in the full exposure window is etched by using a wet etching method, and then the insulating layer 230 in the full exposure window is etched by using a dry etching method, thereby forming the first connection window 231. c2) The half-exposed photoresist is removed by using an O2 ashing method, and then the semiconductor layer 240 in the half exposure window is etched by using a wet etching method, thereby forming a first active layer 141 and a second active layer 241. Finally, the photoresist above the first active layer 141 and the second active layer 241 is removed.

Based on the same inventive concept, the present embodiment further provides a method of manufacturing an organic light emitting diode display, which adopts the above mentioned method to deposit the thin film transistor on the substrate.

To sum up, the method of manufacturing the thin film transistor and the organic light emitting diode display provided by the present invention reduces the times of using a photomask by directly depositing the insulating layer and the semiconductor layer and exposing and half-exposing the photoresist deposited thereon, thereby saving the manufacture time, improving the productivity and economizing the manufacture cost.

It should be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively containing, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors also existing in the process, method, object or device which includes the factors.

While the present invention has been particularly shown and described with reference to exemplary embodiments thereof, it should be understood by those of ordinary skilled in the art that various changes in form and details may be made therein without departing from the spirit and scope of the present invention as defined by the following claims.

What is claimed is:

1. A method of manufacturing a thin film transistor, comprising: depositing a first thin film transistor and a second thin film transistor, wherein the depositing of the second thin film transistor comprising:

a) forming a second gate of the second thin film transistor on a substrate;

b) depositing an insulating layer and a semiconductor layer in order above the substrate, wherein the insulating layer and the semiconductor layer cover the second gate;

c) depositing a photoresist layer above the semiconductor layer and exposing the photoresist layer; etching the semiconductor layer and the insulating layer, thereby forming a second active layer of the second thin film transistor and a first connection window disposed above the second gate; and d) depositing a second source and a second drain of the second thin film transistor above the insulating layer and the second active layer;

wherein the exposing of the photoresist particularly comprising: fully exposing the photoresist where the first connection window is to be formed; not exposing the photoresist where the second active layer is to be formed; and half-exposing the rest of the photoresist above the second thin film transistor.

2. The method of claim 1, wherein the etching of the semiconductor layer and the insulating layer particularly comprising: etching the semiconductor layer and the insulating layer in a full exposure window to form the first connection window; removing the half-exposed photoresist; etching the semiconductor layer in a half exposure window to form the second active layer; and removing the photoresist layer above the second active layer.

3. The method of claim 2, wherein the etching of the semiconductor layer and the insulating layer in a full exposure window particularly comprising: removing the semiconductor layer in the full exposure window using a wet etching method; and removing the insulating layer in the full exposure window using a dry etching method.

4. The method of claim 2, wherein the semiconductor layer in a half exposure window is etched using a wet etching method.

5. The method of claim 2, wherein the half-exposed photoresist is removed using an $O_2$ ashing method.

6. The method of claim 2, wherein the first drain of the first thin film transistor is electrically connected to the second gate through the first connection window.

7. The method of claim 6, wherein the first and second thin film transistors are both the metal oxide thin film transistors, and the first and second thin film transistors both have a BCE structure or an ESL structure.

8. The method of claim 1, wherein the first drain of the first thin film transistor is electrically connected to the second gate through the first connection window.

9. The method of claim 8, wherein the first and second thin film transistors are both the metal oxide thin film transistors, and the first and second thin film transistors both have a BCE structure or an ESL structure.

10. The method of claim 1, wherein the first drain of the first thin film transistor is electrically connected to the second gate through the first connection window.

11. The method of claim 10, wherein the first and second thin film transistors are both the metal oxide thin film transistors, and the first and second thin film transistors both have a BCE structure or an ESL structure.

12. A method of manufacturing an organic light emitting diode display, comprising: depositing a thin film transistor on a substrate, wherein the method of manufacturing a thin film transistor comprising: depositing the first thin film transistor and the second thin film transistor, the depositing of the second thin film transistor comprising:

a) forming a second gate of the second thin film transistor on the substrate;

b) depositing an insulating layer and a semiconductor layer in order above the substrate, wherein the insulating layer and the semiconductor layer cover the second gate;

c) depositing a photoresist layer above the semiconductor layer and exposing the photoresist layer; etching the semiconductor layer and the insulating layer, thereby forming a second active layer of the second thin film transistor and a first connection window disposed above the second gate; and d) depositing a second source and a second drain of the second thin film transistor above the insulating layer and the second active layer;

wherein the exposing of the photoresist particularly comprising: fully exposing the photoresist where the first connection window is to be formed; not exposing the photoresist where the second active layer is to be formed; and half-exposing the rest of the photoresist above the second thin film transistor.

13. The method of claim 12, wherein the etching of the semiconductor layer and the insulating layer particularly comprising: etching the semiconductor layer and the insulating layer in the full exposure window to form the first connection window; removing the half-exposed photoresist; etching the semiconductor layer in the half exposure window to form the second active layer; and removing the photoresist layer above the second active layer.

14. The method of claim 13, wherein the etching of the semiconductor layer and the insulating layer in the full exposure window particularly comprising: removing the semiconductor layer in the full exposure window using a wet etching method; and removing the insulating layer in the full exposure window using a dry etching method.

15. The method of claim 13, wherein the semiconductor layer in the half exposure window is etched using a wet etching method.

16. The method of claim 13, wherein the half-exposed photoresist is removed using an $O_2$ ashing method.

17. The method of claim 12, wherein the first drain of the first thin film transistor is electrically connected to the second gate through the first connection window.

18. The method of claim 17, wherein the first and second thin film transistors are both the metal oxide thin film transistors, and the first and second thin film transistors both have a BCE structure or an ESL structure.

19. A method of manufacturing a thin film transistor, comprising: depositing a first thin film transistor and a second thin film transistor, wherein the depositing of the second thin film transistor comprising:

a) forming a second gate of the second thin film transistor on a substrate;

b) depositing an insulating layer and a semiconductor layer in order above the substrate, wherein the insulating layer and the semiconductor layer cover the second gate;

c1) depositing a photoresist layer above the semiconductor layer;

c2) exposing the photoresist layer;

c3) etching the semiconductor layer and the insulating layer, thereby forming a second active layer of the second thin film transistor and a first connection window disposed above the second gate; and d) depositing a second source and a second drain of the second thin film transistor above the insulating layer and the second active layer;

wherein the step of exposing of the photoresist layer comprises: fully exposing the photoresist where the first connection window is to be formed; not exposing the photoresist where the second active layer is to be formed; and partially-exposing the rest of the photoresist above the second thin film transistor.

20. The method of claim 19, wherein the semiconductor layer in a partial exposure window is etched using a wet etching method.

* * * * *